(12) United States Patent
Liao et al.

(10) Patent No.: US 10,726,899 B2
(45) Date of Patent: *Jul. 28, 2020

(54) SEMICONDUCTOR STRUCTURES, MEMORY CELLS AND DEVICES COMPRISING FERROELECTRIC MATERIALS, SYSTEMS INCLUDING SAME, AND RELATED METHODS

(71) Applicant: Micron Technology, Inc., Boise, ID (US)

(72) Inventors: Albert Liao, Boise, ID (US); Wayne I. Kinney, Boise, ID (US); Yi Fang Lee, Boise, ID (US); Manzar Siddik, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/201,478

(22) Filed: Nov. 27, 2018

(65) Prior Publication Data

US 2019/0096897 A1 Mar. 28, 2019

Related U.S. Application Data

(63) Continuation of application No. 15/590,863, filed on May 9, 2017, now Pat. No. 10,319,426.

(51) Int. Cl.
*G11C 11/22* (2006.01)
*H01L 27/11507* (2017.01)
(Continued)

(52) U.S. Cl.
CPC ........ *G11C 11/221* (2013.01); *G11C 11/2297* (2013.01); *H01L 27/11507* (2013.01);
(Continued)

(58) Field of Classification Search
CPC ......... H01L 27/11507; H01L 27/11509; H01L 28/55; G11C 11/2297; G11C 11/221
See application file for complete search history.

(56) References Cited

U.S. PATENT DOCUMENTS 5,131,582 A 7/1992 Kaplan et al.
5,519,566 A 5/1996 Perino et al.
(Continued)

FOREIGN PATENT DOCUMENTS

CN 102010195 A 4/2011

OTHER PUBLICATIONS

Taiwanese Office Action and Search Report from Taiwanese Application No. 107115512, dated Dec. 22, 2018, 11 pages.
(Continued)

*Primary Examiner* — David Lam
(74) *Attorney, Agent, or Firm* — TraskBritt

(57) ABSTRACT

A semiconductor structure includes an electrode, a ferroelectric material adjacent the electrode, the ferroelectric material comprising an oxide of at least one of hafnium and zirconium, the ferroelectric material doped with bismuth, and another electrode adjacent the ferroelectric material on an opposite side thereof from the first electrode. Related semiconductor structures, memory cells, semiconductor devices, electronic systems, and related methods are disclosed.

22 Claims, 5 Drawing Sheets

(51) Int. Cl.
 *H01L 49/02* (2006.01)
 *H01L 27/11509* (2017.01)

(52) U.S. Cl.
 CPC ........ *H01L 27/11509* (2013.01); *H01L 28/40* (2013.01); *H01L 28/55* (2013.01); *G11C 11/2273* (2013.01); *G11C 11/2275* (2013.01)

(56) References Cited

U.S. PATENT DOCUMENTS

| | | | |
|---|---|---|---|
| 6,858,883 B2 | 2/2005 | Fricke et al. | |
| 7,387,934 B2 | 6/2008 | Ozawa et al. | |
| 7,514,272 B2 | 4/2009 | Fukada et al. | |
| 7,709,359 B2 | 5/2010 | Boescke et al. | |
| 7,781,813 B2 | 8/2010 | Tamura et al. | |
| 7,927,889 B2 | 4/2011 | Mitsui | |
| 8,198,625 B2 | 6/2012 | Yoon et al. | |
| 8,304,823 B2 | 11/2012 | Boescke | |
| 9,012,878 B1 | 4/2015 | Mathur | |
| 9,053,802 B2 | 6/2015 | Muller et al. | |
| 9,142,639 B2 | 9/2015 | Kim et al. | |
| 9,169,557 B2 | 10/2015 | Hatanpaa et al. | |
| 9,231,206 B2 | 1/2016 | Tao et al. | |
| 9,337,421 B2 | 5/2016 | Chin et al. | |
| 9,460,770 B1 | 10/2016 | Nicholes et al. | |
| 9,520,556 B2 | 12/2016 | Horii et al. | |
| 10,319,426 B2* | 6/2019 | Liao | H01L 27/11509 |
| 2004/0241501 A1 | 12/2004 | Takeshi et al. | |
| 2005/0068822 A1 | 3/2005 | Takeshi et al. | |
| 2006/0214204 A1 | 9/2006 | Yoo et al. | |
| 2006/0263909 A1 | 11/2006 | Choi et al. | |
| 2007/0111335 A1 | 5/2007 | Miyazawa et al. | |
| 2007/0243640 A1 | 10/2007 | Tamura | |
| 2008/0062615 A1 | 3/2008 | Rappe et al. | |
| 2010/0135937 A1 | 6/2010 | O'Brien et al. | |
| 2011/0281718 A1* | 11/2011 | Krishna | C04B 35/462 |
| | | | 501/138 |
| 2014/0355328 A1 | 12/2014 | Muller et al. | |
| 2014/0363740 A1 | 12/2014 | Holme et al. | |
| 2015/0179934 A1 | 6/2015 | Mathur et al. | |
| 2015/0340372 A1 | 11/2015 | Pandey et al. | |
| 2016/0064391 A1* | 3/2016 | Li | H01L 27/10897 |
| | | | 365/145 |
| 2016/0365133 A1 | 12/2016 | Ino et al. | |

OTHER PUBLICATIONS

International Written Opinion from International Application No. PCT/US2018/029508, dated Aug. 2, 2018, 7 pages.
International Search Report from International Application No. PCT/US2018/029508, dated Aug. 2, 2018, 3 pages.

* cited by examiner

SEMICONDUCTOR STRUCTURES, MEMORY CELLS AND DEVICES COMPRISING FERROELECTRIC MATERIALS, SYSTEMS INCLUDING SAME, AND RELATED METHODS

CROSS-REFERENCE TO RELATED APPLICATION

This application is a continuation of U.S. patent application Ser. No. 15/590,863, filed May 9, 2017, now U.S. Pat. No. 10,319,426, issued Jun. 11, 2019, the disclosure of which is hereby incorporated herein in its entirety by this reference.

TECHNICAL FIELD

Embodiments disclosed herein relate to semiconductor structures including one or more ferroelectric materials, to related memory cells, to methods of forming such semiconductor structures and memory cells, and to memory devices and systems including such devices. More particularly, embodiments of the disclosure relate to ferroelectric semiconductor structures and memory cells including ferroelectric materials including doped hafnium oxide materials, to methods of forming such semiconductor structures and memory cells, to memory devices including such cells, and to systems including such devices.

BACKGROUND

Non-volatile memory devices are an important element of electronic systems due to their ability to maintain data absent a power supply. Ferroelectric random-access memory (FeRAM, FRAM) cells have been considered for use in non-volatile memory devices. Some non-volatile memory cells include ferroelectric materials exhibiting a switchable polarization responsive to application of an electric field (e.g., a bias voltage). Ferroelectric materials may include at least two polarization states, which polarization states may be switched by the application of the electric field. The polarization state of the ferroelectric material in a FeRAM cell may be used to determine a logic state (e.g., a 1 or a 0) of the FeRAM cell. After removal of the electric field, the polarization state of the ferroelectric material may remain stable for at least some period of time. Accordingly, the ferroelectric material may be suitable for use in a non-volatile memory device, eliminating the need to refresh the cell periodically.

Perovskite materials, such as lead zirconate titanate (PZT), have commonly been used as ferroelectric materials in FeRAM cells. However, such conventional ferroelectric materials often fall short in terms of bit density and scalability because perovskite materials exhibit low remnant polarization ($P_r$), a strength of which may correlate to a readout signal for the associated memory cell. For FeRAM cells, the thickness of the ferroelectric PZT film must be up to about 200 nm to achieve suitable properties since PZT loses its ferroelectric properties at lower thicknesses. Thus, the use of conventional ferroelectric materials for memory devices having a feature size of 20 nm or less has been limited. In addition, conventional ferroelectric materials, such as PZT, possess limited compatibility with standard semiconductor processing techniques.

DETAILED DESCRIPTION

Figure 1:
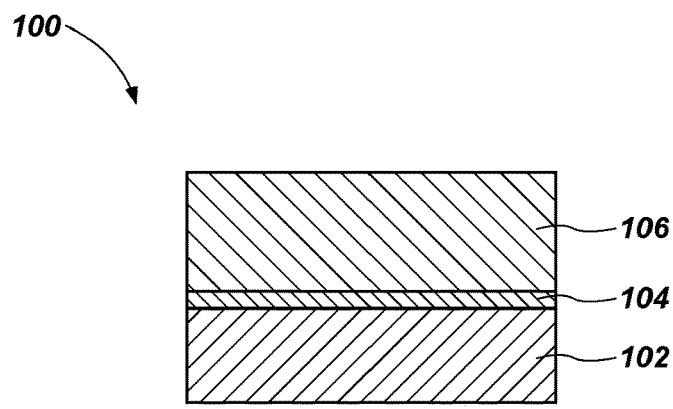
FIG. 1 is a cross-sectional view of a capacitor including a ferroelectric material, according to embodiments of the disclosure.

The illustrations included herewith are not meant to be actual views of any particular systems or semiconductor structures, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure or a memory cell comprising a ferroelectric material, or a complete description of a process flow for manufacturing such semiconductor structures or memory cells. The structures described below do not form a complete semiconductor structure or a complete memory cell. Only those process acts and structures necessary to understand the embodiments described herein are described in detail below. Additional acts to form a complete semiconductor structure or memory cell including the structures described herein may be performed by conventional techniques.

According to embodiments disclosed herein, a ferroelectric material may include a metal oxide doped with bismuth. In some embodiments, the metal oxide includes hafnium oxide ($HfO_2$, also referred to in the art as "hafnia"), zirconium oxide ($ZrO_2$, also referred to in the art as "zirconia"), or a combination thereof. The metal oxide may be crystallized to form the ferroelectric material. The ferroelectric material may be doped with between about 0.1 atomic percent (at. %) bismuth and about 10.0 atomic percent bismuth, based on the metal atoms (e.g., non-oxygen atoms) in the ferroelectric material. The ferroelectric material may include hafnium bismuth oxide ($HfBiO_x$), hafnium zirconium bismuth oxide (HfZrBiO$_x$), zirconium bismuth oxide (ZrBiO$_x$), hafnium zirconate (HfZrO$_4$), another hafnium-containing material, another zirconium-containing material, other ferroelectric materials doped with bismuth, or combinations thereof. The bismuth may be uniformly distributed throughout a thickness of the ferroelectric material. In other embodiments, the ferroelectric material may exhibit a varying concentration of bismuth throughout a thickness thereof. In some embodiments, the ferroelectric material may include at least another dopant, such as at least one of magnesium, yttrium, strontium, niobium, tantalum, lanthanum, gadolinium, vanadium, phosphorus, potassium, scandium, ruthenium, selenium, calcium, barium, aluminum, arsenic, and indium. The ferroelectric material may exhibit an orthorhombic crystal phase. In some embodiments, the ferroelectric material may be formed on a substrate exhibiting a crystal phase other than orthorhombic (e.g., tetragonal, cubic, hexagonal, rhombohedral). In other embodiments, the ferroelectric material may overlie (e.g., be formed on) a material exhibiting an amorphous phase and may exhibit a substantially uniform and orthorhombic crystal phase. The ferroelectric material may be used in one or more of a ferroelectric semiconductor structure, a ferroelectric memory cell, a ferroelectric field effect transistor (FeFET), a ferroelectric tunnel junction (FTJ), or another ferroelectric device.

In some embodiments, the ferroelectric material may exhibit improved ferroelectric properties compared to conventional ferroelectric materials. In some embodiments, the ferroelectric material may exhibit up to a twenty-five percent increase in a magnitude of a remnant polarization and a value of 2P$_r$, which is equal to a difference between the positive remnant polarization and the negative polarization remnant of the ferroelectric material after removal of an external electric field. The increase in the remnant polarization may correspond to an increased readout signal during use and operation of an associated memory cell. Accordingly, a memory cell including the ferroelectric material may exhibit an improved memory readout signal compared to a memory cell including a conventional ferroelectric material. In some embodiments, a memory cell including the ferroelectric material of the present disclosure may have a useful life that is longer than a useful life of a memory cell including a conventional ferroelectric material (e.g., may be cycled more times prior to exhibiting reduced ferroelectric properties).

As used herein, the term "doped" means and includes a material that includes an impurity that may alter or influence a crystal lattice of the material to modify electric properties (e.g., electric conductivity, ferroelectricity, etc.) of the material. In some instances, the dopant may inhabit lattice sites in the crystal lattice of the material.

FIG. 1 illustrates a capacitor 100 including a ferroelectric material 104. The capacitor 100 may form a part of a memory cell according to embodiments of the disclosure and may include a bottom electrode 102, the ferroelectric material 104 over the bottom electrode 102, and a top electrode 106 over the ferroelectric material 104. The capacitor 100 may be, for example, a metal-insulator-metal (MIM) capacitor. While the capacitor 100 is described and illustrated as being used in ferroelectric memory cells, the disclosure is not so limited and the capacitor 100 may be used in other non-volatile memory cells.

The bottom electrode 102 may include a conductive material. In some embodiments, the bottom electrode 102 includes titanium, titanium nitride (TiN), titanium aluminum nitride (TiAlN), tantalum nitride (TaN), tungsten, tungsten nitride (WN), ruthenium, iridium, platinum, a silicon-containing material (e.g., titanium silicon nitride (TiSiN), tungsten silicide (WSi$_x$)), a metal silicide, polysilicon, another conductive material, or combinations thereof. The bottom electrode 102 may be formed by sputtering, atomic layer deposition (ALD), chemical vapor deposition (CVD), physical vapor deposition (PVD), plasma enhanced chemical vapor deposition (PECVD), low pressure chemical vapor deposition (LPCVD), or other suitable process.

The ferroelectric material 104 may directly overlie and contact the bottom electrode 102. The ferroelectric material 104 may include a material that exhibits a polarization (e.g., a displacement of oppositely charged ions to create a dipole moment) that is switchable by an external electric field during use and operation of a memory cell including the ferroelectric material 104. In other words, the ferroelectric material 104 may be formed of a material formulated to exhibit a switchable polarization responsive to exposure to a switching voltage, typically in an opposite direction as the initially applied electric field. In addition, the ferroelectric material 104 may be formulated to exhibit a remnant polarization (P$_r$) that may remain after removal of the external electric field. In other words, the ferroelectric material 104 may be formulated to exhibit a non-zero polarization after an external electric field is removed (e.g., when the ferroelectric material 104 is not exposed to an external electric field). A direction of such polarization may be dependent on the direction and the history of the electric field previously applied to the ferroelectric material 104. Accordingly, the ferroelectric material 104 may exhibit hysteresis. As a result, the polarization of the ferroelectric material 104 may be interpreted as a logic state (e.g., a 1 or a 0) of the associated memory cell.

The ferroelectric material 104 may include a metal oxide doped with bismuth. In some embodiments, the metal oxide may include one or more of hafnium oxide, zirconium oxide, hafnium zirconate (HfZrO$_4$), another hafnium-containing material, another zirconium-containing material, and combinations thereof.

In some embodiments, the ferroelectric material 104 comprises hafnium oxide doped with bismuth. In some such embodiments, the ferroelectric material 104 may include a material including hafnium, bismuth, and oxygen atoms and may be referred to herein as hafnium bismuth oxide. For convenience, the composition of hafnium bismuth oxide may be abbreviated as "HfBiO$_x$," which does not indicate the stoichiometry of the hafnium, bismuth, and oxygen atoms in the ferroelectric material 104. In other embodiments, the ferroelectric material 104 may include zirconium oxide doped with bismuth. In some such embodiments, the ferroelectric material 104 may include zirconium, bismuth, and oxygen atoms and may be referred to herein as zirconium bismuth oxide. For convenience, the composition of zirconium bismuth oxide may be abbreviated as "ZrBiO$_x$," which does not indicate the stoichiometry of the zirconium, bismuth, or oxygen atoms in the ferroelectric material. In yet other embodiments, the ferroelectric material 104 may include hafnium zirconium bismuth oxide, which may be abbreviated as "HfZrBiO$_x$," and which does not indicate the stoichiometry of hafnium, zirconium, bismuth, and oxygen in the ferroelectric material 104.

The ferroelectric material 104 may include between about 0.1 atomic percent (at. %) and about 10.0 atomic percent bismuth, based on the metal atoms of the metal oxide and the dopant (i.e., based on non-oxygen atoms of the ferroelectric material 104). Stated another way, bismuth may constitute between about 0.1 atomic percent and about 10.0 atomic percent of the metals and the dopant material in the ferroelectric material 104 (e.g., based on the non-oxygen atoms in the ferroelectric material 104). By way of nonlimiting example, bismuth may constitute between about 0.1 atomic percent and about 0.3 atomic percent, between about 0.3 atomic percent and about 0.5 atomic percent, between about 0.5 atomic percent and about 1.0 atomic percent, between about 1.0 atomic percent and about 3.0 atomic percent, between about 3.0 atomic percent and about 5.0 atomic percent, or between about 5.0 atomic percent and about 10.0 atomic percent of the ferroelectric material 104, excluding the oxygen atoms in the ferroelectric material 104. In some embodiments, bismuth constitutes about 0.3 atomic percent of the ferroelectric material 104, excluding the oxygen atoms.

Since, in some embodiments, the ferroelectric material 104 may comprise about two oxygen atoms for every metal atom (for every atom of hafnium, zirconium, bismuth, or other dopant atom), bismuth may constitute between about 0.15 atomic percent and about 5.0 atomic percent of the ferroelectric material 104, including the oxygen atoms.

In some embodiments, the ferroelectric material 104 may include an oxide having the general formula $Hf_xZr_{(1-x-y)}Bi_yO_z$, wherein x is between about 0 and about 1.0, y is between about 0.01 and about 0.10, and z is between about 1.0 and about 3.0. In some embodiments, an atomic percent of hafnium may be greater than an atomic percent of zirconium. In some such embodiments, x may be between about 0.50 and about 0.99, such as between about 0.50 and about 0.60, between about 0.60 and about 0.70, between about 0.70 and about 0.80, between about 0.80 and about 0.90, or between about 0.90 and about 0.99, and y may be between about 0 and about 0.49, such as between about 0 and about 0.10, between about 0.10 and about 0.20, between about 0.20 and about 0.30, between about 0.30 and about 0.40, or between about 0.40 and about 0.49. A value of y may be between about 0.01 and about 0.10, such as between about 0.001 and about 0.003, between about 0.003 and about 0.005, between about 0.005 and about 0.01, between about 0.01 and about 0.03, between about 0.03 and about 0.05, or between about 0.05 and about 0.10. In some embodiments, z is equal to about 2.0.

The ferroelectric material 104 may exhibit a uniform concentration of bismuth throughout a thickness thereof (e.g., throughout a vertical direction illustrated in FIG. 1). In some such embodiments, the ferroelectric material 104 may exhibit substantially the same atomic percent of bismuth proximate the bottom electrode 102 as an atomic percent of bismuth proximate the top electrode 106. Similarly, the ferroelectric material 104 may exhibit substantially the same atomic percent of bismuth at a central portion thereof (e.g., at a location located about a same distance from the top electrode 106 as from the bottom electrode 102) as an atomic percent of bismuth proximate each of the bottom electrode 102 and the top electrode 106.

In other embodiments, the ferroelectric material 104 may exhibit a non-uniform atomic percent of bismuth across a thickness thereof. In some such embodiments, the ferroelectric material 104 may exhibit a gradient of bismuth. Accordingly, different portions of the ferroelectric material 104 may exhibit a different atomic percent of bismuth than other portions thereof. By way of nonlimiting example, some portions of the ferroelectric material 104 may be free of bismuth while other portions thereof may include differing atomic percentages of bismuth. In some embodiments, portions of the ferroelectric material 104 proximate the bottom electrode 102 and the top electrode 106 may include a greater atomic percent of bismuth than portions of the ferroelectric material 104 distal from the bottom electrode 102 and the top electrode 106. In other embodiments, portions of the ferroelectric material 104 proximate the bottom electrode 102 and the top electrode 106 may include a lesser atomic percent of bismuth than portions of the ferroelectric material 104 distal from the bottom electrode 102 and the top electrode 106.

The ferroelectric material 104 may further include at least another dopant in addition to bismuth. The another dopant may be selected from the group consisting of magnesium, yttrium, strontium, niobium, tantalum, lanthanum, gadolinium, vanadium, phosphorus, potassium, scandium, ruthenium, selenium, calcium, barium, aluminum, arsenic, indium, and silicon. In some embodiments, the at least another dopant includes magnesium. In some such embodiments, the ferroelectric material 104 may include bismuth and magnesium. In embodiments where the ferroelectric material 104 includes hafnium oxide, the ferroelectric material 104 may comprise hafnium bismuth magnesium oxide ($HfBiMgO_x$). In other embodiments, the ferroelectric material 104 may include hafnium zirconium bismuth magnesium oxide ($HfZrBiMgO_x$). In yet other embodiments, the ferroelectric material 104 may include zirconium bismuth magnesium oxide ($ZrBiMgO_x$). In other embodiments, the ferroelectric material 104 may include aluminum hafnium bismuth oxide ($AlHfBiO_x$), aluminum zirconium bismuth oxide ($AlZrBiO_x$), or aluminum hafnium zirconium bismuth oxide ($AlHfZrBiO_x$).

An atomic percent of the another dopant in the ferroelectric material 104 may be between about 0.1 atomic percent and about 25.0 atomic percent, based on the metal atoms of the metal oxide, the bismuth, and the another dopant (i.e., based on non-oxygen atoms of the ferroelectric material 104). In some embodiments, an atomic percent of the another dopant and the bismuth may be between about 0.1 atomic percent and about 0.3 atomic percent, between about 0.3 atomic percent and about 0.5 atomic percent, between about 0.5 atomic percent and about 1.0 atomic percent, between about 1.0 atomic percent and about 3.0 atomic percent, between about 3.0 atomic percent and about 5.0 atomic percent, between about 5.0 atomic percent and about 10.0 atomic percent, or between about 10.0 atomic percent and about 25.0 atomic percent of the ferroelectric material 104, excluding oxygen. In other embodiments, an atomic percent of each of bismuth and the another dopant may be between about 0.1 atomic percent and about 10.0 atomic percent. In other embodiments, the atomic percent of the another dopant in the ferroelectric material 104 may be between about 0.1 atomic percent and about 10.0 atomic percent, based on the metal atoms of the metal oxide, the bismuth, and the another dopant (i.e., based on non-oxygen atoms of the ferroelectric material 104). In some embodiments, such as where the ferroelectric material 104 is doped with silicon, the ferroelectric material 104 may comprise hafnium silicate ($HfSiO_x$) doped with bismuth.

The ferroelectric material 104 may exhibit a uniform concentration of the another dopant throughout a thickness thereof. In some such embodiments, the ferroelectric material 104 may exhibit substantially the same atomic percent of the another dopant proximate the bottom electrode 102 as an atomic percent of the another dopant proximate the top electrode 106. Similarly, the ferroelectric material 104 may exhibit substantially the same atomic percent of the another dopant at a central portion thereof (e.g., at a location located about a same distance from the top electrode 106 as from the bottom electrode 102).

In other embodiments, the ferroelectric material 104 may exhibit a non-uniform atomic percent of the another dopant across a thickness thereof. In some embodiments, the ferroelectric material 104 may exhibit a gradient of the another dopant. Accordingly, some portions of the ferroelectric material 104 may exhibit a different atomic percent of the another dopant than other portions thereof. By way of nonlimiting example, different portions of the ferroelectric material 104 may be free of the another dopant while other portions thereof may include a relatively greater atomic percent of the another dopant. In some embodiments, portions of the ferroelectric material 104 proximate the bottom electrode 102 and the top electrode 106 may exhibit a greater atomic percent of the another dopant than portions of the ferroelectric material 104 distal from the bottom electrode 102 and the top electrode 106. In other embodiments, portions of the ferroelectric material 104 proximate the bottom electrode 102 and the top electrode 106 may exhibit a lesser atomic percent of the another dopant than portions of the ferroelectric material 104 distal from the bottom electrode and the top electrode 106. In some embodiments, portions of the ferroelectric material 104 having a lower atomic percent of bismuth may exhibit a greater atomic percent of the another dopant. Similarly, portions of the ferroelectric material 104 having a greater atomic percent of bismuth may exhibit a lower atomic percent of the another dopant.

The ferroelectric material 104 may have a thickness between about 10 Å and about 200 Å, such as between about 10 Å and about 20 Å, between about 20 Å and about 30 Å, between about 30 Å and about 50 Å, between about 50 Å and about 100 Å, or between about 100 Å and about 200 Å. In some embodiments, the thickness of the ferroelectric material 104 is about 10 Å. In other embodiments, the thickness of the ferroelectric material 104 may be about 100 Å. The ferroelectric material 104 may have a lesser thickness compared to conventional ferroelectric materials and still exhibit desired ferroelectric properties and may not exhibit current leakage therethrough. It is believed that the bismuth in the ferroelectric material 104 facilitates sufficient ferroelectric properties in the ferroelectric material 104, even at the lesser thicknesses relative to conventional ferroelectric materials. Compared to conventional ferroelectric materials, the ferroelectric material 104 may exhibit a lower operation voltage. Without wishing to be bound by any particular theory, it is believed that the bismuth of the ferroelectric material 104 facilitates desired ferroelectric properties at relatively lower thicknesses compared to conventional ferroelectric materials.

The ferroelectric material 104 may be formed by one or more of ALD, CVD, PVD, PECVD, LPCVD, or other suitable process. In some embodiments, the ferroelectric material 104 is formed by sputtering. In some such embodiments, different components of the ferroelectric material 104 may be sputtered simultaneously. In some such embodiments, a deposition chamber (e.g., a sputtering chamber) may include a plurality of targets. The targets may include bismuth oxide ($B_2O_3$) and at least one metal oxide target. In some embodiments, the at least one metal oxide target may include at least one of hafnium oxide and zirconium oxide. In some embodiments, the deposition chamber may include at least a bismuth oxide target, at least a hafnium oxide target, and at least a zirconium oxide target.

In some embodiments, the bismuth oxide and the at least one metal oxide target may be sputtered simultaneously to form the ferroelectric material 104 exhibiting a uniform atomic percent of bismuth therethrough and comprising at least one of hafnium oxide and zirconium oxide. One or more parameters (e.g., a power density applied to each target) may be adjusted to control a composition of the ferroelectric material formed by co-sputtering. In some embodiments, a power density applied to the at least one metal oxide target may be greater than a power density applied to the bismuth oxide target.

In some embodiments, the deposition chamber may further include at least one target comprising a dopant material other than bismuth. By way of nonlimiting example, the deposition chamber may include at least one target comprising the at least another dopant and configured to resputter at least one of magnesium, yttrium, strontium, niobium, tantalum, lanthanum, gadolinium, vanadium, phosphorus, potassium, scandium, ruthenium, selenium, calcium, barium, aluminum, arsenic, indium, and silicon. In some embodiments, the target of the at least another dopant may comprise an oxide of the at least another dopant.

In other embodiments, the ferroelectric material 104 may be formed by atomic layer deposition or chemical vapor deposition. In some such embodiments, an atomic percent of the bismuth may not be uniform across a thickness of the ferroelectric material 104. Similarly, an atomic percent of one or more metal oxides may not be uniform across a thickness of the ferroelectric material 104.

Atomic vapor deposition and chemical vapor deposition techniques are known in the art and are, therefore, not described in detail herein. By way of nonlimiting example, a first portion of the ferroelectric material 104 may be formed by introducing at least one metal precursor into a deposition chamber. An oxidizer (e.g., oxygen, ozone, water, hydrogen peroxide, etc.) may be introduced into the deposition chamber to oxidize the at least one metal oxide precursor and form a metal on an exposed surface of a substrate or an electrode (e.g., the bottom electrode 102). One or more cycles may be performed to form a desired thickness of the at least one metal oxide. In some embodiments, one or more cycles of bismuth oxide deposition may be performed, such as by cycling a bismuth precursor followed by an oxygen source to form bismuth oxide on the surface of the material. Accordingly, in some embodiments, the ferroelectric material 104 may include a first portion (e.g., a first layer) comprising or consisting essentially of the at least one metal oxide, a second portion (e.g., a second layer) comprising or consisting essentially of bismuth oxide over the first portion, and a third portion (e.g., a third layer) comprising or consisting essentially of the at least one metal oxide over the bismuth oxide. The ferroelectric material 104 may include a plurality of distinct portions of the bismuth oxide and a plurality of portions of the at least one metal oxide. In some embodiments, the ferroelectric material 104 may include one or more distinct portions of another dopant, as described above.

The ferroelectric material 104 may exhibit a crystal phase such that the ferroelectric material 104 exhibits ferroelectric properties. In some embodiments, a crystal phase of the ferroelectric material 104 may be orthorhombic. The ferroelectric material 104 may exhibit a spontaneous electric polarization that may be reversed responsive to exposure to an external electric field and may exhibit a nonzero remnant polarization ($P_r$) after removal of the external electric field. In other words, the ferroelectric material 104 may exhibit a hysteresis. Surprisingly, forming the ferroelectric material 104 with bismuth improves ferroelectric properties of the ferroelectric material 104, even though bismuth is not a rare earth element, as are many other materials that may induce ferroelectric properties in metal oxide materials. Without wishing to be bound by any particular theory, it is believed that the composition of the ferroelectric material 104, and the method of formation thereof, facilitates formation of an orthorhombic crystal phase and ferroelectric properties.

After forming the ferroelectric material 104, the ferroelectric material may be annealed to induce a desired crystal phase in the ferroelectric material 104. In some embodiments, the ferroelectric material 104 may be annealed to form an orthorhombic crystal phase. In some embodiments, the ferroelectric material 104 is exposed to a temperature between about 400° C. and about 800° C., such as between about 400° C. and about 600° C., or between about 600° C. and about 800° C. for a time between about 10 seconds and about 1 hour, such as between about 10 seconds and about 30 seconds, between about 30 seconds and about 1 minute, between about 1 minute and about 10 minutes, between about 10 minutes and about 30 minutes, or between about 30 minutes and about 1 hour. In some embodiments, the ferroelectric material 104 is exposed to a temperature of about 600° C. for about 30 seconds. However, the disclosure is not so limited and the ferroelectric material 104 may be annealed at a different temperature or for a different length of time. In other embodiments, the ferroelectric material 104 may exhibit a desired crystalline phase (e.g., the orthorhombic phase) during formation thereof. By way of nonlimiting example, the ferroelectric material 104 may be formed in an orthorhombic phase when the ferroelectric material 104 is formed by ALD or CVD.

The top electrode 106 may directly overlie and contact the ferroelectric material 104. The top electrode 106 may include a conductive material. In some embodiments, the top electrode 106 includes titanium, titanium nitride, titanium aluminum nitride, tantalum nitride, tungsten, tungsten nitride, ruthenium, iridium, platinum, a silicon-containing material (e.g., titanium silicon nitride, tungsten silicide), a metal silicide, polysilicon, another conductive material, or combinations thereof. The top electrode 106 may be formed by sputtering, atomic layer deposition, chemical vapor deposition, physical vapor deposition, plasma enhanced chemical vapor deposition, low pressure chemical vapor deposition, or other suitable process.

In some embodiments, the top electrode 106 may comprise the same material as the bottom electrode 102. In other embodiments, the top electrode 106 includes a material that is different than the bottom electrode 102.

Accordingly, in one embodiment, a semiconductor structure comprises an electrode, another electrode, and a ferroelectric material comprising an oxide of at least one of hafnium, zirconium, and bismuth between the electrode and the another electrode.

Accordingly, in one embodiment, a method of forming a semiconductor structure comprises forming an electrode, forming a ferroelectric material comprising bismuth and at least one of hafnium oxide and zirconium oxide the electrode, and forming another electrode over the ferroelectric material.

Figure 2:
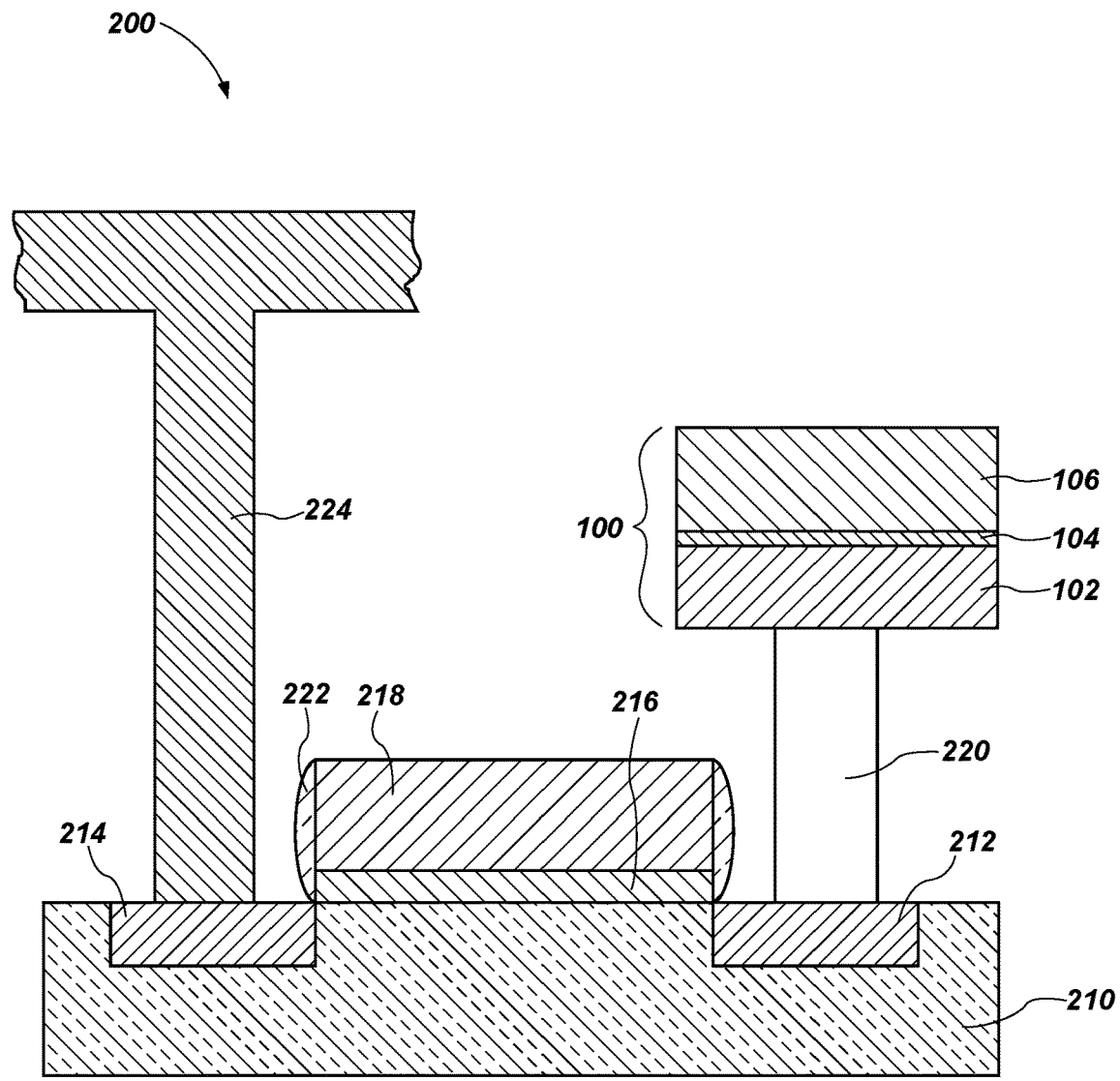
FIG. 2 is a cross-sectional view of a memory cell including the capacitor, according to embodiments of the disclosure.

Referring to FIG. 2, a memory cell 200 including the capacitor 100 is shown. The memory cell 200 includes a substrate 210 and a source region 214 and a drain region 212 formed within the substrate 210. The substrate 210 may be a semiconductor substrate, a base semiconductor material on a supporting substrate, a metal electrode, or a semiconductor substrate having one or more materials, structures, or regions formed thereon. The substrate 210 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form material, regions, or junctions in the base semiconductor structure or foundation.

The memory cell 200 may include an access transistor including a gate oxide material 216 and a gate electrode 218. The capacitor 100 may be connected to the drain region 212 of the transistor via a conductive contact (e.g., a conductive plug) 220. The conductive contact 220 may overlie the drain region 212 and may directly contact the bottom electrode 102 of the capacitor 100. The conductive contact 220 may include a conductive material, such as, for example, tungsten, titanium, aluminum, copper, polysilicon, or other suitable conductive material.

The gate oxide material 216 may include a suitable dielectric material. In some embodiments, the gate oxide material 216 includes silicon dioxide, or a high-k dielectric material such as zirconium oxide, hafnium oxide, aluminum oxide ($Al_2O_3$), yttrium oxide ($Y_2O_3$), or other high-k dielectrics known in the art. The source region 214 and the drain region 212 may be located on opposing sides of the gate oxide material 216.

The gate electrode 218 may include a conductive material, such as, for example, titanium, tantalum, tungsten, ruthenium, nitrides thereof, polysilicon, or other suitable conductive gate electrode material.

Sidewall spacers 222 may be disposed on a side of the gate oxide material 216 and the gate electrode 218. The sidewall spacers 222 may comprise a dielectric material, such as silicon dioxide or silicon nitride.

An access line 224 (e.g., a digit line, a bit line, etc.) may be coupled to the source region 214 and configured to apply a voltage to the source region 214. The access line 224 may include a conductive material such as, for example, tungsten, titanium, tantalum, palladium, platinum, silicides thereof, polysilicon, or other suitable conductive material.

Although the memory cell 200 has been described as comprising the capacitor 100 including the ferroelectric material 104, the disclosure is not so limited. In other embodiments, the memory cell 200 may comprise a field effect transistor (FeFET). In some such embodiments, the gate oxide material 216 may comprise the ferroelectric material 104. Stated another way, the gate oxide material 216 may include a ferroelectric material comprising at least one of hafnium oxide and zirconium oxide doped with bismuth, as described above with reference to the ferroelectric material 104. In some embodiments, the ferroelectric material 104 may overlie and directly contact the substrate 210.

In some embodiments, the memory cell 200 may include a ferroelectric material 104 at the gate oxide material 216 and the capacitor 100.

In other embodiments, the ferroelectric material 104 (FIG. 1) may be incorporated in a ferroelectric tunnel junction (FTJ) or another ferroelectric device. In some such embodiments, the ferroelectric material 104 may be disposed between two metal electrodes comprising, for example, tungsten, titanium, copper, platinum, silver, gold, polysilicon, other electrode materials, and combinations thereof.

The ferroelectric material 104 may have a thickness between about 5 Å and about 50 Å, such as between about 5 Å and about 10 Å, between about 10 Å and about 20 Å, between about 20 Å and about 30 Å, or between about 30 Å and about 50 Å.

Accordingly, in one embodiment, a memory cell comprises a capacitor overlying a conductive material in contact with a source region or a drain region. The capacitor comprises a first electrode over a substrate, a ferroelectric material comprising hafnium oxide, zirconium oxide, or a combination thereof and bismuth over the first electrode, and a second electrode over the ferroelectric material.

Figure 3:
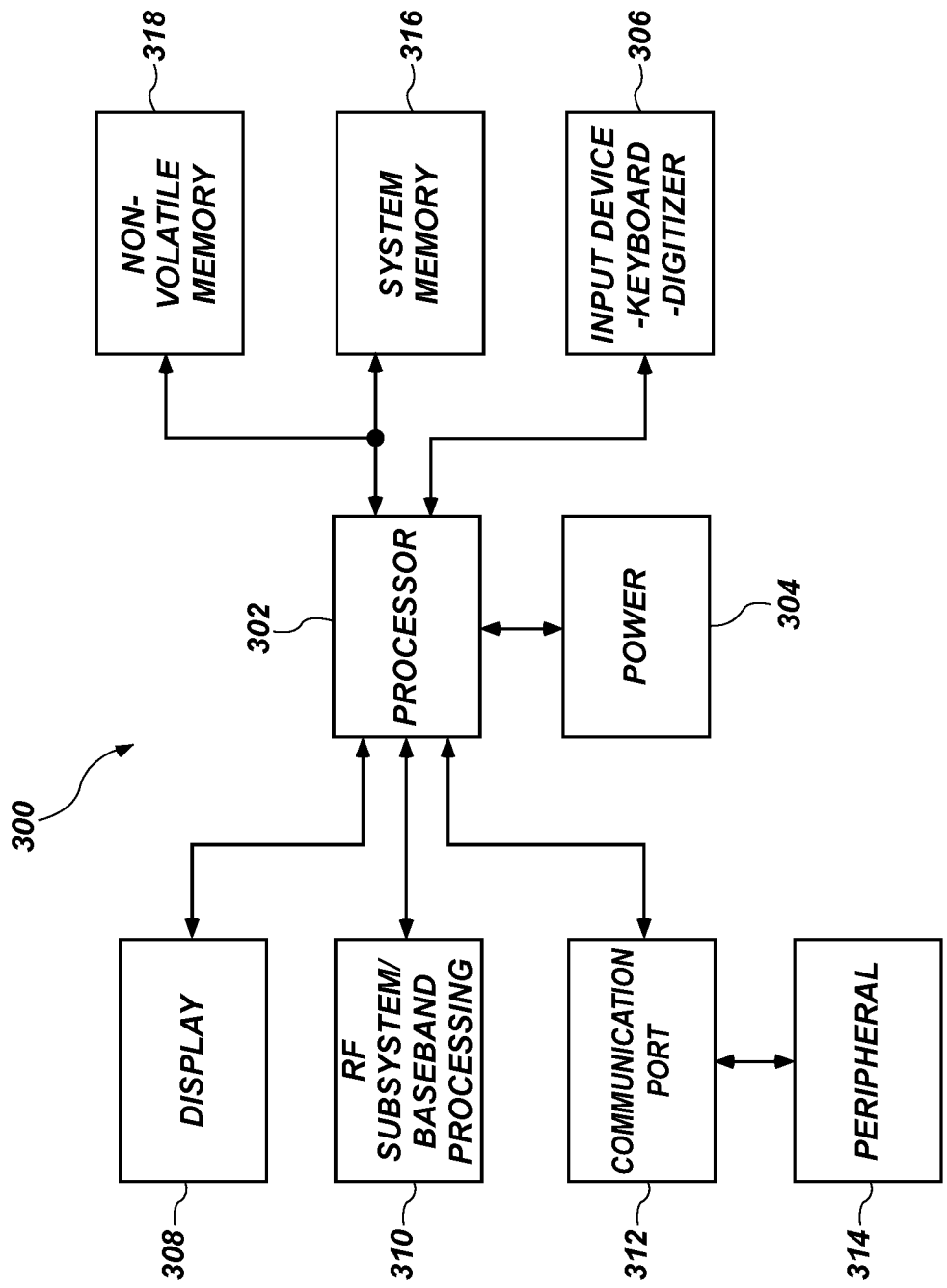
FIG. 3 is a simplified block diagram of a system implemented according to one or more embodiments of the disclosure.

With reference to FIG. 3, depicted is a processor-based system 300. The processor-based system 300 may include various electronic devices manufactured in accordance with embodiments of the present disclosure. The processor-based system 300 may be any of a variety of types such as a computer, camera, pager, cellular phone, wireless device, display, chip set, set-top box, personal organizer, control circuit, or other electronic device. The processor-based system 300 may include one or more processors 302, such as a microprocessor, to control the processing of system functions and requests in the processor-based system 300. The processor 302 and other subcomponents of the processor-based system 300 may include or be coupled to memory cells, memory arrays, and semiconductor devices including the ferroelectric material comprising at least one of hafnium oxide and zirconium oxide doped with bismuth in accordance with embodiments of the present disclosure.

The processor-based system 300 may include a power supply 304 in operable communication with the processor 302. For example, if the processor-based system 300 is a portable system, the power supply 304 may include one or more of a fuel cell, a power scavenging device, permanent batteries, replaceable batteries, and rechargeable batteries. The power supply 304 may also include an AC adapter; therefore, the processor-based system 300 may be plugged into a wall outlet, for example. The power supply 304 may also include a DC adapter such that the processor-based system 300 may be plugged into a vehicle cigarette lighter receptacle or a vehicle power port, for example.

Various other devices may be coupled to the processor 302 depending on the functions that the processor-based system 300 performs. For example, a user interface 306 may be coupled to the processor 302. The user interface 306 may include input devices such as buttons, switches, a keyboard, a light pen, a mouse, a digitizer and stylus, a touch screen, a voice recognition system, a microphone, or a combination thereof. A display 308 may also be coupled to the processor 302. The display 308 may include a liquid crystal display (LCD), a surface-conduction electron-emitter display (SED), a cathode ray tube (CRT) display, a digital light processing (DLP) display, a plasma display, an organic light-emitting diode (OLED) display, a light emitting diode (LED) display, a three-dimensional projection, an audio display, or a combination thereof. Furthermore, an RF sub-system/baseband processor 310 may also be coupled to the processor 302. The RF sub-system/baseband processor 310 may include an antenna that is coupled to an RF receiver and to an RF transmitter (not shown). A communication port 312, or more than one communication port 312, may also be coupled to the processor 302. The communication port 312 may be adapted to be coupled to one or more peripheral devices 314, such as a modem, a printer, a computer, a scanner, or a camera, or to a network, such as a local area network, remote area network, intranet, or the Internet, for example.

The processor 302 may control the processor-based system 300 by implementing software programs stored in the memory. The software programs may include an operating system, database software, drafting software, word processing software, media editing software, or media playing software, for example. The memory is operably coupled to the processor 302 to store and facilitate execution of various programs. For example, the processor 302 may be coupled to system memory 316, which may include one or more types of volatile memory, such as dynamic random access memory (DRAM). The system memory 316 may further include other types of volatile memory, non-volatile memory, or a combination thereof. In some embodiments, the system memory 316 may include semiconductor devices, such as the semiconductor devices including memory cells and memory arrays including the ferroelectric materials described above.

The processor 302 may also be coupled to non-volatile memory 318. The non-volatile memory 318 may include one or more of STT-MRAM, MRAM, read-only memory (ROM) such as an EPROM, resistive read-only memory (RROM), and Flash memory to be used in conjunction with the system memory 316. The size of the non-volatile memory 318 is typically selected to be just large enough to store any necessary operating system, application programs, and fixed data. Additionally, the non-volatile memory 318 may include a high capacity memory such as disk drive memory, such as a hybrid-drive including resistive memory or other types of non-volatile solid-state memory, for example.

Figure 4:
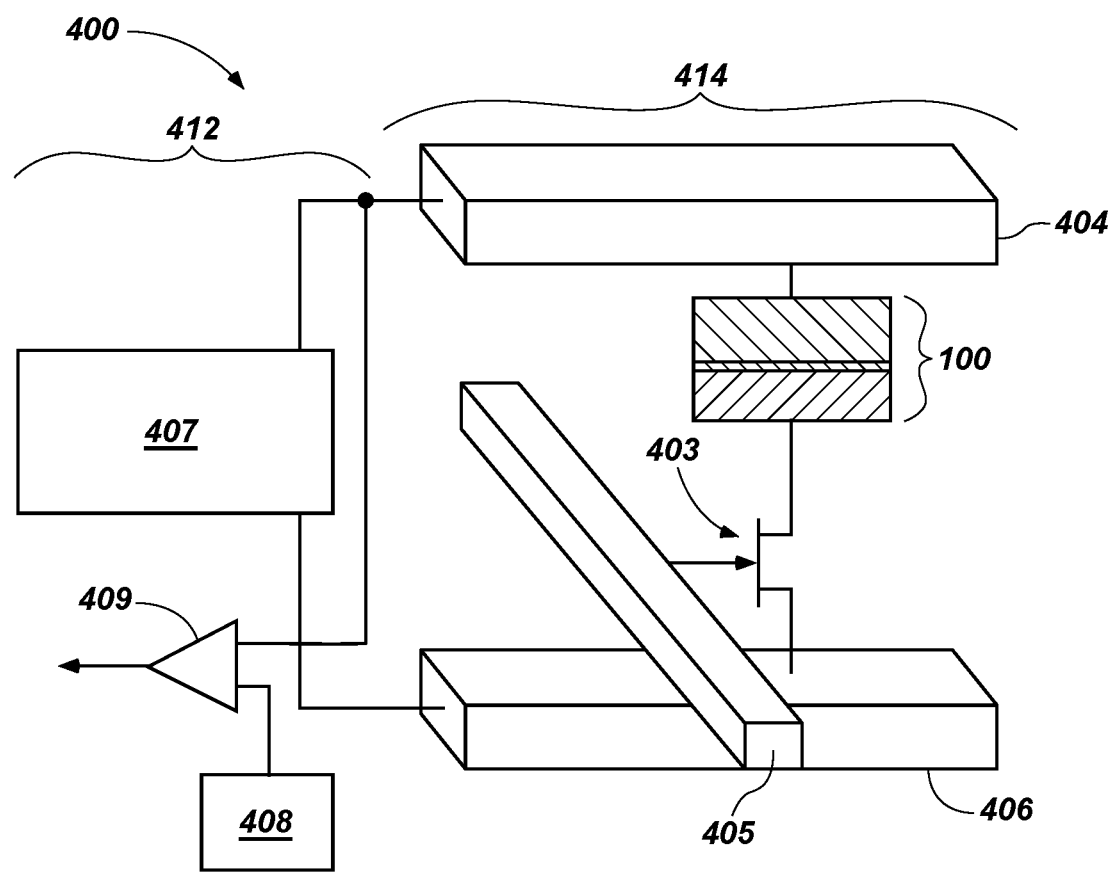
FIG. 4 is a schematic of a system including FeRAM cells having a capacitor, according to embodiments of the disclosure.

FIG. 4 is a system 400, which may also be characterized as a semiconductor device or incorporated in a semiconductor device including FeRAM cells having a capacitor, according to embodiments of the disclosure. The system 400 may include peripheral devices 412 in operable communication with a FeRAM cell 414, a grouping of which may be fabricated to form an array of memory cells in a grid pattern including a number of rows and a number of columns, or in various other arrangements, depending on the system requirements and fabrication technology. The FeRAM cell 414 may include a cell core including the capacitor 100, an access transistor 403, a conductive material that may function as a data/sense line 404 (e.g., a bit line), a conductive material that may function as an access line 405 (e.g., a word line), and a conductive material that may function as a source line 406. The peripheral devices 412 of the system 400 may include read/write circuitry 407, a bit line reference 408, and a sense amplifier 409. The capacitor 100 may be substantially the same as the capacitor described above with reference to FIG. 1.

In use and operation, when a FeRAM cell 414 is selected to be programmed, a programming voltage may be applied to the FeRAM cell 414 to change a polarization state of the ferroelectric material of the capacitor 100. When the programming voltage is removed, the ferroelectric material may exhibit a polarization, as described above with reference to the ferroelectric material 104 in FIG. 1. In a read operation of the FeRAM cell 414, a voltage is used to detect a state of the ferroelectric material 104.

To initiate programming of the FeRAM cell 414, the read/write circuitry 407 may generate a read voltage to the data/sense line 404 and the source line 406. The polarity of the voltage between the data/sense line 404 and the source line 406 may determine the polarization direction of the ferroelectric material in the capacitor 100. The programmed logic state of the FeRAM cell 414 may be a function of the direction of polarization of the ferroelectric material of the capacitor 100.

To read the FeRAM cell 414, the read/write circuitry 407 may generate a read voltage to the data/sense line 404 and the source line 406 through the capacitor 100 and the access transistor 403. The programmed state of the FeRAM cell 414 may be related to a direction of the polarization of the ferroelectric material in the capacitor 100.

Accordingly, in one embodiment, a semiconductor device comprises an array of memory cells, each memory cell of the array of memory cells comprising a capacitor coupled to a conductive material in contact with a source region or a drain region. The capacitor comprises a first electrode and a second electrode, and a ferroelectric material comprising hafnium oxide, zirconium oxide, or a combination thereof and bismuth between the first electrode and the second electrode.

Accordingly, in other embodiments, an electronic system comprises a processor, a memory array operably coupled to the processor, the memory array comprising memory cells, each memory cell of the array of memory cells comprising a capacitor operably coupled to a conductive material in contact with a source region or a drain region. The capacitor comprises a first electrode, a ferroelectric material comprising hafnium oxide, zirconium oxide, or a combination thereof and bismuth adjacent the first electrode, and a second electrode adjacent the ferroelectric material on an opposite side thereof from the first electrode. The electronic system further comprises a power supply in operable communication with the processor.

Example

Figure 5A:
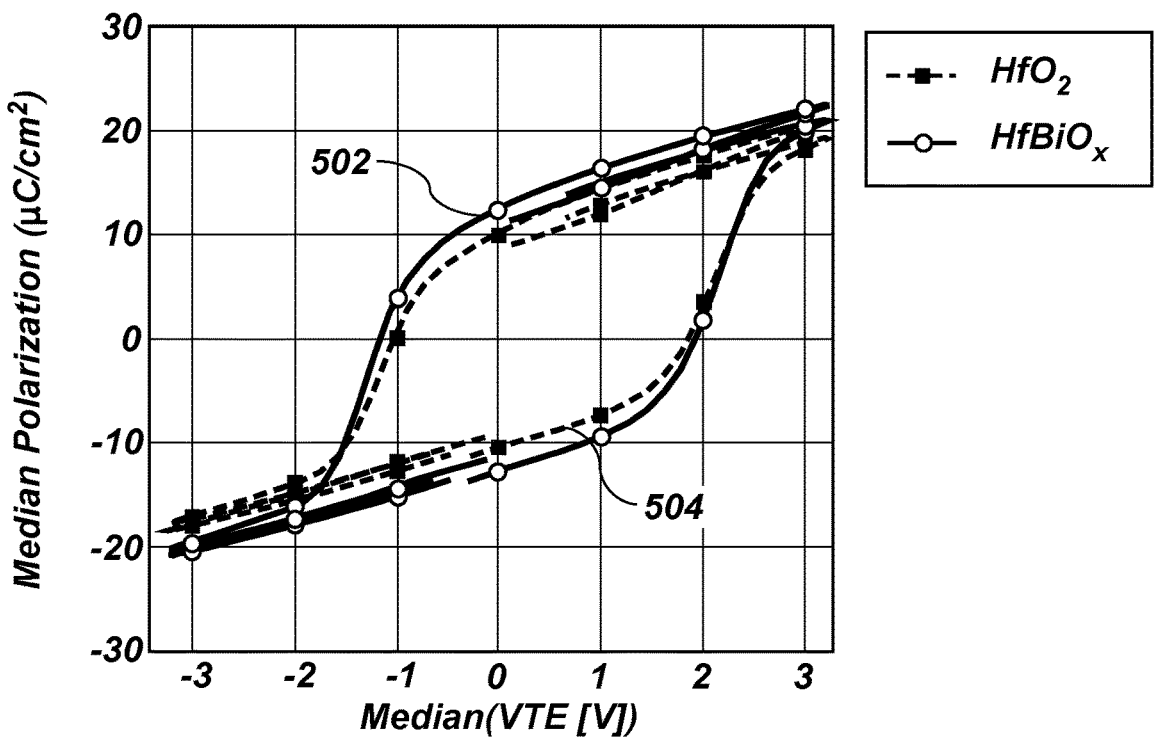
FIG. 5A is a graph comparing a hysteresis curve of a bismuth-doped ferroelectric material, according to embodiments of the disclosure, compared to a hysteresis curve of a conventional undoped ferroelectric material.

FIG. 5A is a graph comparing a hysteresis curve of a bismuth-doped ferroelectric material, according to embodiments of the disclosure, compared to a hysteresis curve of a conventional undoped ferroelectric material. The ferroelectric material was substantially the same as the ferroelectric material 104 described above with reference to FIG. 1. The ferroelectric material included hafnium oxide doped with bismuth and comprised hafnium bismuth oxide. The conventional ferroelectric material included undoped hafnium oxide having a crystalline phase such that it exhibited ferroelectric properties. The ferroelectric materials were disposed between a pair of electrodes (e.g., a top electrode and a bottom electrode). The ferroelectric material including the bismuth exhibited a hysteresis curve 502 having a greater remnant polarization ($P_r$) compared to a hysteresis curve 504 of the conventional ferroelectric material. The ferroelectric material including bismuth exhibited both a positive remnant polarization and a negative remnant polarization having a greater magnitude than a respective positive remnant polarization and a negative remnant polarization of the conventional ferroelectric material.

Figure 5B:
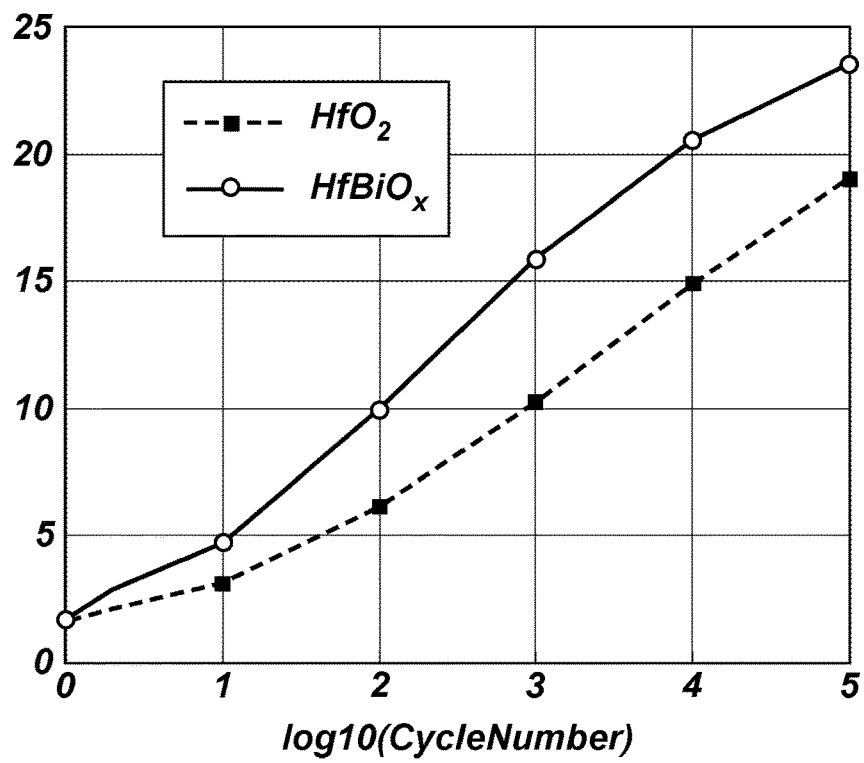
FIG. 5B is a graph of a signal strength vs. cycle number of a memory cell including the bismuth-doped ferroelectric material, according to embodiments of the disclosure, compared to a signal strength vs. cycle number of a conventional memory cell including the conventional ferroelectric material.

FIG. 5B is a graph of a signal strength vs. cycle number of a memory cell including the ferroelectric material including bismuth, according to embodiments of the disclosure, compared to a signal strength vs. cycle number of a conventional memory cell including the conventional ferroelectric material comprising hafnium dioxide. FIG. 5B illustrates that the memory cell including the ferroelectric material including bismuth exhibited an about twenty-five percent (25%) greater for the $2P_r$ value of the conventional ferroelectric material.

Figure 5C:
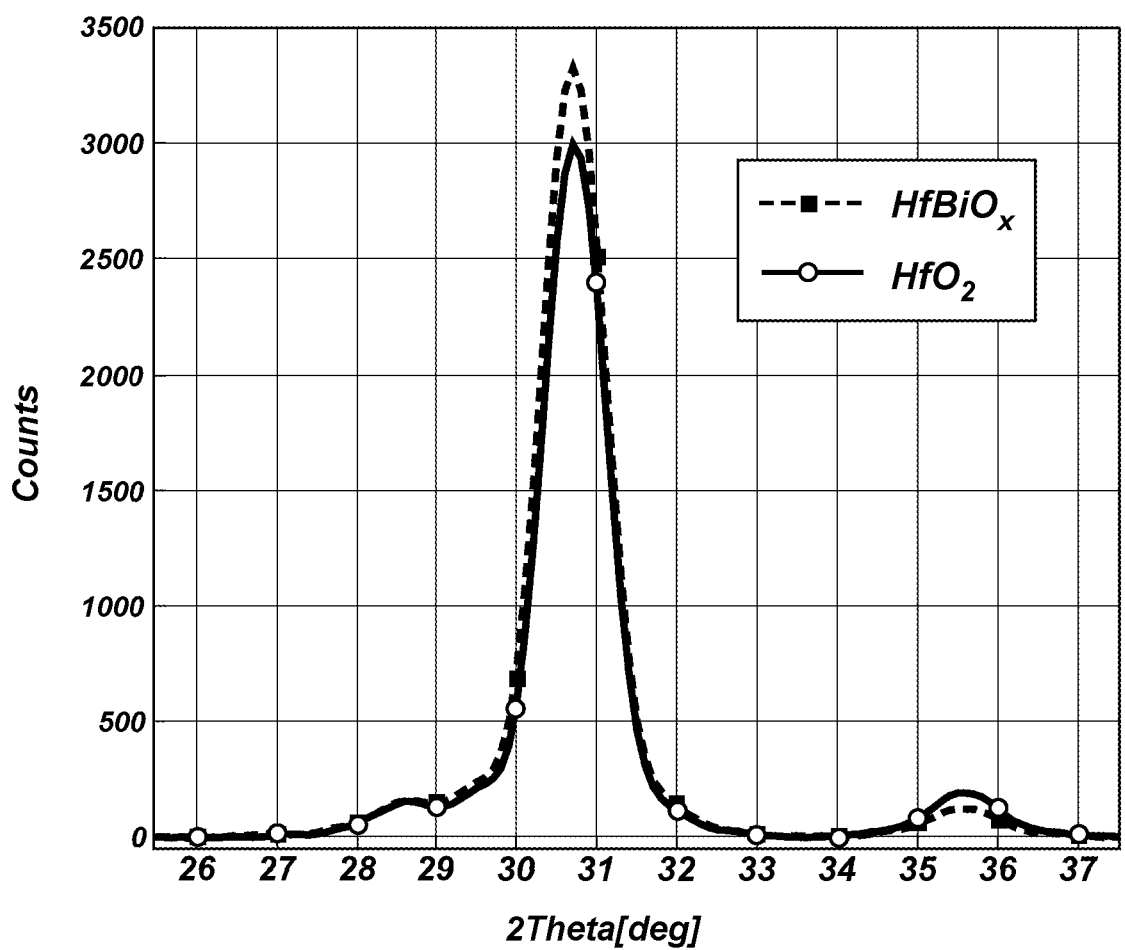
FIG. 5C is a graph illustrating a crystal phase of the ferroelectric material including the bismuth compared to the conventional ferroelectric material.

FIG. 5C is a graph illustrating a crystal phase of the ferroelectric material including the bismuth compared to the conventional ferroelectric material. The ferroelectric material including the bismuth exhibited a greater peak at an angle of about 30.5° compared to the conventional ferroelectric material, indicating a more crystalline film with more grains oriented in the orthorhombic phase. Accordingly, the ferroelectric material comprising hafnium bismuth oxide exhibited a greater crystallinity than the conventional ferroelectric material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device, comprising:
   an electrode;
   another electrode; and
   a ferroelectric material comprising hafnium oxide and bismuth between the electrode and the another electrode.

2. The semiconductor device of claim 1, wherein the ferroelectric material comprises hafnium oxide doped with bismuth.

3. The semiconductor device of claim 1, wherein the ferroelectric material comprises bismuth at between about 0.1 atomic percent and about 10.0 atomic percent of the ferroelectric material based on non-oxygen atoms of the ferroelectric material.

4. The semiconductor device of claim 1, wherein the ferroelectric material is free of zirconium.

5. The semiconductor device of claim 1, wherein the ferroelectric material further comprises at least one material selected from the group consisting of magnesium, yttrium, strontium, niobium, tantalum, lanthanum, gadolinium, vanadium, phosphorus, potassium, scandium, ruthenium, selenium, calcium, barium, aluminum, arsenic, indium, and silicon.

6. The semiconductor device of claim 5, wherein the ferroelectric material comprises between about 0.1 atomic percent and about 10.0 atomic percent of bismuth and the at least one material based on non-oxygen atoms of the ferroelectric material.

7. The semiconductor device of claim 1, wherein the ferroelectric material comprises a uniform concentration of bismuth throughout a thickness thereof.

8. The semiconductor device of claim 1, wherein the ferroelectric material further comprises aluminum.

9. The semiconductor device of claim 1, wherein the ferroelectric material further comprises zirconium.

10. The semiconductor device of claim 1, wherein an atomic percent of bismuth in the ferroelectric material exhibits a gradient.

11. The semiconductor device of claim 1, wherein the ferroelectric material has a thickness between about 10 Å and about 200 Å.

12. The semiconductor device of claim 1, wherein the ferroelectric material comprises hafnium zirconium bismuth oxide.

13. A semiconductor device, comprising:
an array of memory cells, memory cells of the array of memory cells comprising a capacitor coupled to a conductive material in contact with a source region or a drain region, the capacitor comprising:
a first electrode and a second electrode; and
a ferroelectric material comprising hafnium oxide, zirconium oxide, or a combination thereof and bismuth between the first electrode and the second electrode.

14. The semiconductor device of claim 13, wherein the first electrode overlies a base material and further comprising another ferroelectric material comprising hafnium oxide, zirconium oxide, or a combination thereof over the base material, the another ferroelectric material doped with bismuth.

15. The semiconductor device of claim 14, further comprising a gate electrode overlying the another ferroelectric material over the base material.

16. The semiconductor device of claim 14, wherein the another ferroelectric material comprises bismuth at between about 0.1 atomic percent and about 0.3 atomic percent of the another ferroelectric material based on non-oxygen atoms of the another ferroelectric material.

17. The semiconductor device of claim 14, wherein at least one of the ferroelectric material or the another ferroelectric material further comprises at least one of aluminum or magnesium.

18. The semiconductor device of claim 14, wherein at least one of the ferroelectric material or the another ferroelectric material is selected from the group consisting of hafnium bismuth magnesium oxide (HfBiMgO$_x$), hafnium zirconium bismuth magnesium oxide (HfZrBiMgO$_x$), zirconium bismuth magnesium oxide (ZrBiMgO$_x$), aluminum hafnium bismuth oxide (AlHfBiO$_x$), aluminum zirconium bismuth oxide (AlZrBiO$_x$), and aluminum hafnium zirconium bismuth oxide (AlHfZrBiO$_x$).

19. A method of forming a semiconductor structure, the method comprising:
forming an electrode;
forming a ferroelectric material comprising hafnium oxide doped with bismuth adjacent the electrode; and
forming another electrode adjacent the ferroelectric material opposite the electrode.

20. The method of claim 19, wherein forming a ferroelectric material comprises forming the ferroelectric material to comprise between about 0.1 atomic percent and about 10.0 atomic percent bismuth based on non-oxygen atoms of the ferroelectric material.

21. The method of claim 19, wherein forming a ferroelectric material comprises forming the ferroelectric material comprising at least one of aluminum or magnesium.

22. An electronic system, comprising:
a processor;
a memory array operably coupled to the processor, the memory array comprising memory cells, memory cells of the array of memory cells comprising a capacitor operably coupled to a conductive material in contact with a source region or a drain region, the capacitor comprising:
a first electrode;
a ferroelectric material adjacent the first electrode, the ferroelectric material comprising a material selected from the group consisting of one or more of hafnium bismuth oxide, zirconium bismuth oxide, hafnium zirconium bismuth oxide, hafnium bismuth magnesium oxide, hafnium zirconium bismuth magnesium oxide, zirconium bismuth magnesium oxide, aluminum hafnium bismuth oxide, aluminum zirconium bismuth oxide, or aluminum hafnium zirconium bismuth oxide; and
a second electrode adjacent the ferroelectric material on an opposite side thereof from the first electrode; and
a power supply in operable communication with the processor.

* * * * *